(12) United States Patent
Yates et al.

(10) Patent No.: US 6,224,991 B1
(45) Date of Patent: May 1, 2001

(54) PROCESS FOR ELECTRODEPOSITION OF BARRIER LAYER OVER COPPER FOIL BONDING TREATMENT, PRODUCTS THEREOF AND ELECTROLYTE USEFUL IN SUCH PROCESS

(75) Inventors: Charles B. Yates, Princeton; George Gaskill, Manahawkin, both of NJ (US); Chinsai T. Cheng, Orange, CT (US); Ajesh Shah, West Windsor; Adam M. Wolski, Edgewater, both of NJ (US); Paul DuFresne, Langhorne, PA (US)

(73) Assignee: Yates Foil USA, Inc., Bordentown, NJ (US)

( * ) Notice: Subject to any disclaimer, the term of this patent is extended or adjusted under 35 U.S.C. 154(b) by 0 days.

(21) Appl. No.: 09/394,682

(22) Filed: Sep. 13, 1999

(51) Int. Cl.[7] ............................. B32B 15/20; C25D 3/12; C25D 5/10; C25D 7/06
(52) U.S. Cl. ........................ 428/607; 428/612; 428/675; 428/935; 205/111; 205/170; 205/182; 205/269
(58) Field of Search ................................... 428/607, 612, 428/626, 675, 600, 935; 205/111, 182, 170, 269; 106/1.05

(56) References Cited

U.S. PATENT DOCUMENTS

| | | | |
|---|---|---|---|
| 3,585,010 | * 6/1971 | Luce et al. | 29/191.2 |
| 3,857,681 | 12/1974 | Yates et al. | 29/195 |
| 3,857,683 | * 12/1974 | Castonguay | 29/195 |
| 4,456,508 | * 6/1984 | Torday et al. | 204/27 |
| 4,468,293 | * 8/1984 | Polan et al. | 204/27 |
| 4,572,768 | 2/1986 | Wolski et al. | 204/15 |
| 4,619,871 | * 10/1986 | Takami et al. | 428/607 |
| 5,207,889 | 5/1993 | Wolski et al. | 205/155 |
| 5,366,814 | * 11/1994 | Yamanishi et al. | 428/607 |

FOREIGN PATENT DOCUMENTS 4-96393 * 3/1992 (JP) .

OTHER PUBLICATIONS

"Table 1. Representative Cobalt Plating Baths," *Modern Electroplating: Third Edition*, A Wiley–Interscience Publication (no date).
Bauer, Henry H., "3.4.4 Potential Distribution in the Diffuse Layer," *Modern Ideas Concerning Electrode Reactions*, Georg Thieme Publishers Stuttgart, 1972, p. 45. (no month).
Evans, Ulick R., "Other Elements on Oxidation and Film–Growth: Alloys containing Cobalt," *The Corrosion and Oxidation of Metals: Scientific Principles and Practical Applications*, Edward Arnold (Publications) Ltd., p. 66. (no date).

* cited by examiner

Primary Examiner—John J. Zimmerman
(74) Attorney, Agent, or Firm—Finnegan, Henderson, Farabow, Garrett & Dunner, L.L.P.

(57) ABSTRACT

Treated copper foil for use in the manufacture of copper-clad laminates for printed circuit boards, wherein a continuous, very thin cobalt barrier layer, which is substantially non-ferromagnetic, is electrodeposited on a copper bonding treatment electrodeposited on a bonding side of a base copper foil; and a process and electrolyte for producing such treated foil, wherein the electrolyte contains a low concentration of cobalt and certain addition agents.

11 Claims, 2 Drawing Sheets

INVENTION

LITTLE COBALT DEPOSITED

LARGE AMOUNT OF COBALT DEPOSITED

INVENTION

1000X

PROCESS FOR ELECTRODEPOSITION OF BARRIER LAYER OVER COPPER FOIL BONDING TREATMENT, PRODUCTS THEREOF AND ELECTROLYTE USEFUL IN SUCH PROCESS

FIELD OF THE INVENTION

This invention relates to electrodeposited copper foil for use in the manufacture of copper-clad laminates for printed circuit boards (PCB's), the foil having a copper bond-enhancing treatment electrodeposited on a bonding side of a base foil and a thin cobalt barrier layer electrodeposited on the treatment wherein the cobalt is deposited as a continuous layer on micro-peaks and micro-valleys forming the surface of the treatment. This invention also relates to a process for producing such foil and an electrolyte useful in such process.

BACKGROUND OF THE INVENTION

Copper foil used in the manufacture of PCB's is typically produced on a rotating drum cathode machine partially immersed in a sulfuric acid/copper sulfate electrolyte, wherein an electric current is passed through the electrolyte from one or more anodes to the drum cathode to electrodeposit the copper foil on the surface of the cathode. The resulting foil had one side with a relatively smooth (shiny) surface, often referred to as the drum side, and the opposite side, which has a velvety (matte) surface, is often referred to as the electrolyte side. The microprofile of the electrolyte side of the raw foil is formed of micro-peaks and micro-valleys when observed under a microscope.

In the field of electrodeposited copper foil destined for printed circuits, "barrier layer" is a term to describe a metallic coating plated over a copper bond-enhancing treatment deposited on a bonding side of a copper raw, or base, foil.

Thus, the barrier layer forms the outer perimeter of the bonding treatment, and as such interfaces with polymeric substrates in the manufacture of copper clad laminates. The basic raw material for the manufacture of printed circuits is a laminate clad with copper foil which comprises of a thin copper foil firmly bonded to a polymeric, dielectric (insulating) substrate material. This "bonding" operation is carried in laminating plants and involves heating and cooling cycles. Sheets of copper foil are laid upon sheets of "prepreg" (e.g. glass fabric impregnated with epoxy resin). Both materials are placed in a hydraulic press, having pressing plates which are heated, while the two materials are pressed together (high psi). At selected temperatures, the resin liquefies and is forced, by the pressure, to flow into the micro-irregularities of the foil surface. This is followed with a second cycle, when both materials are cooled, while the pressure is maintained. The resin solidifies in the irregularities on the foil surface and both materials are firmly bonded together and are very difficult to pull apart. The "peel strength" between both materials is high, because the bonding side of the copper foil is provided with the bond-enhancing treatment. High peel strength is a characteristic of the highest importance since the mechanical support of the circuit elements, as well as the current carrying capability of PCB's, is provided by the copper foil - polymer joint. It is essential that the foil is bonded very tightly and securely to the laminate and also that such an adhesive joint can withstand all the manufacturing steps in PCB's fabrication without a decrease of the initial adhesion, which, moreover should remain constant through the service life of the PCB.

The bonding treatment, usually formed in two steps, typically includes a first dendritic copper deposit, followed by an encapsulating, or gilding, layer of copper, as disclosed in U.S. Pat. Nos. 3,857,681, 4,572,768 and 5,207,889, and is composed of copper, while the barrier layer deposited on the treatment is composed of zinc or brass, a zinc-nickel alloy, or another metal essentially chemically inert to the polymeric substance, which, in the process of lamination is in a semi-liquid, flowing state to effect the bonding to the treated side (surface) of the copper foil. The most common polymeric substrate used in the fabrication of printed circuits is a glass fabric impregnated with epoxy resin. Epoxy curing agents (catalysts, hardeners) belong usually to the class of organic derivatives of ammonia, are highly reactive chemically, and typically they are: amine complexes, e.g., tertiary amines, polyamines, aromatic polyamines, etc. Probably the most known epoxy curing agent is dicyandiamide $NH_2C(HH)(NHCN)$.

Reactivity of copper with ammonium compounds (amines, amides) is well known, and explains the need for the barrier layer. The purpose of the barrier layer is to prevent direct copper resin contact.

If the bonding treatment composed of copper only (no barrier layer) is subjected to lamination with an epoxy substrate, the metallic copper reacts with the amino catalysts present in the resin. These reactions are particularly harmful to the quality of the printed circuits. They create moisture at the interface between the copper and the resin, causing harmful effects of measling and possibly de-lamination. In search of excellent dimensional stability, dielectric properties and long service life of PCB's, there has been a growing importance of new polymeric substrates that are superior in these respects to epoxy based materials.

Most of the new materials that are now commonly used in the manufacture of multilayer printed circuit board (MLB's) have glass transition temperatures ($T_g$) substantially higher than epoxy. Fabrication of copper clad polyimide laminates require a 450° F. laminating temperature compared with 325° F. for epoxy, and a laminating time of 8 hours, compared with 3 hours for epoxy.

Polymers such as polyetherimides, polyamide-imide, polyphenylene sulfide have glass transition temperatures in excess of 480° C., while Union Carbide's Udel (polysulfone) resin requires a laminating temperature of about 700° F.

In addition, post baking operations are now practiced commonly, again in order to improve dimensional stability of printed circuit boards. By this practice copper clad laminates, e.g., epoxy based, are typically kept in ovens at temperatures of 380° F. for 16 hours.

The idea is that any dimensional changes of copper clad laminate, shrinkage, warp, etc., will occur in the course of the post-bake. Thus the subsequent processing ir the fabrication of MLB's will produce boards that will be faultless in terms of registration and precision.

The practices described above impose very harsh conditions on the copper foil-polymer interface, conditions that threaten the forces of adhesion that join the two materials. Since the outer surface of the bonding treatment is a barrier layer, the harsh conditions of the interface particularly threaten, chemically, integrity and performance of Barrier layers on polyimide-grade treatments have to withstand much higher laminating and post-bake temperatures, compared to the treatments destined for epoxy applications. High temperature at the metal-polymer interface can subject the metal surface to oxidation, with the attendant partial loss of adhesion. A well designed barrier layer will be self-protected, along with the underlying all-copper treatment, from heat oxidation and the loss of bond.

A good barrier layer should offer reasonable permanence and survival ability of the adherence under various conditions encountered during a PCB's manufacturing steps, as well as during PCB's service life. Successful stain proofing is synonymous with forming a stable film on the surface which promotes good adhesion and improves resistance to disbonding by various chemical environments, thus assuring durability to the foil-resin interface. During the manufacturing process of printed circuits, barrier layers are attached in a variety of ways. Narrow tracks of the foil are exposed to etching solutions, acids and hot water rinses, thermal shocks, etc. The chemicals and/or water tend to penetrate from the sides underneath the lines into the foil-polymer interface. If that happens, and it always happens to a degree, the real "functional" width of the track bonded to the polymer is diminished and thus the peel strength of the conductor line is diminished. It is the barrier layer's role to render the interface hermetic and guard it against ingress by the chemical environments. During the operations involving elevated temperatures, e.g., soldering, post-baking cycles, etc. the foil-polymer interface may suffer heat degradation, with the resulting peel strength loss. Here, the barrier layers offer overall shielding, capable of preventing undesirable reactions between the constituents of the resin system and the metal surface. The chemical attack on the circuit lines is a very real phenomenon and an easily demonstrable problem. If a narrow foil line is produced on the polymeric substrate by etching away un-masked foil, the resulting laminate with a narrow line is then subjected to a soak in hydrochloric acid, or boiling water, and then the line is peeled away from the substrate, one can see on both sides of the brass-colored matte side of the strip, well defined, lighter-colored margins where the chemicals have crept underneath and attacked the conductor. It is known that the chemical attack on the conductor lines is to a great extent dependent on the barrier layer.

It is known that the trends in MLB technology include the use of finer lines, increased density, smaller and more closely spaced holes, larger boards, higher speeds, surface mount, higher power dissipation, etc.

Manufacturing processes must continue to meet the above requirements, and the properties of the raw materials used must continually improve to satisfy these demands.

Perhaps two aspects of high quality sophisticated multi-layer board design depend especially on the improved properties of copper foil. These aspects are a dimensional stability as features become smaller and boards bigger, and even more importantly, an improved copper adhesion as etched features become smaller and surface mounted components become more common.

Dimensional stability is the resistance of thin laminates to planar dimensional changes, either shrinkage or expansion, through processing. It is particularly critical in MLB's. The number value used to measure such stability is inches of movement per inch of board length in the X (warp or machine) and Y (fill) directions of the base reinforcement fabric.

It is an opinion of many technical people in the industry that the real issue is not really one of dimensional stability as, for instance, defined in MIL-P-13949 (which describes the changes in X and Y dimension in a piece of laminate after copper is etched off and it has been subjected to various specified thermal processes). The real problem, it is claimed, is the registration of inner layers.

Registration problems which occur during lamination of MLB's seem to defy meaningful correlation to the laminate characteristics called "dimensional stability". There seems little doubt that the facts which affect true position locations of internal lands of MLB's are related to stresses within the foil/laminate construction, which can affect registration later on. In the fabrication of MLB's copper foil is laminated (bonded to polymeric substrates) twice. First, thin, double-sided copper clad laminates are produced. These laminates are then subjected to image patterning and etching away of unwanted copper to produce the desired patterns of circuitry. Several layers of double-sided boards prepared in such a manner are stacked together, with sheets of prepreg (e.g., glass reinforced polymeric resin composites) inserted in between to separate dielectrically each inner board from the other. Such a stack of circuit boards and prepreg is then laminated together to form a monolithic multi-layer board. Later, thru-hole plating of copper is used to ensure the electrical interconnection between all layers of copper-track conductor lines. Increasing sophistication of multi-layer boards (e.g., narrower widths of track lines, narrower spacing between the lines, increasing number of inner layers) create an ever-increasing demand on the quality of copper foil used in the fabrication of MLB's (i.e., HTE foil), and particularly on the aspects of foil quality that depend on the properties of the barrier layer that protects the bonding side of the foil against dis-bonding (delamination) due to under-cutting and thermal-degradation of the initial peel-strength that might result from high laminating temperatures and post-bake operations.

U.S. Pat. No. 3,857,681 (Yates et al.) is an excellent source of information pertaining to the bonding treatment technology. This patent discloses the concept of the sequential, plural layer bonding treatment technology which involves a succession of dendritic-powdery deposit, encapsulating deposit and the barrier layer. This patent discloses detailed process information and the parameters of the electrodeposition of all these layers. This patent discloses two parallel approaches to the practice of the barrier layer step of the overall treatment process. The barrier layer, according to the Yates et al. patent and the practice today by major foil manufacturers, consists of a thin layer of zinc alloy distributed uniformly over the micro-profile of an all-copper bonding treatment created in the course of the first two electrodeposition steps. This zinc-alloy layer, i.e., barrier layer, can be either plated "as is" or created by the heat accelerated diffusion of the metals. Some foil manufacturers electrodeposit brass, yellow zinc-copper alloy. Others electrodeposit zinc, a gray metal, in which case the foil delivered to the laminating plants has the bonding side characterized by the uniform gray color. Since the laminating process involves heat in the course of fabrication of copper clad laminates destined for PCB's, the zinc barrier layer alloys with the underlying all-copper bonding treatment by the process of heat-accelerated diffusion of metals in the solid state. As a result, a layer of yellow, chemically stable alpha brass is thus formed over the surface of all-copper surface. The Yates et al. patent discloses the alternative use of metals such as nickel, cobalt, chromium, cadmium, tin and bronze in the formation of barrier layers. Subsequently, major foil manufacturers have introduced the use of minor amounts of such metals as alloying elements co-deposited with zinc to improve the performance of the barrier layer with respect to high temperatures of lamination required in the fabrication of polyimide laminates, high temperature post-bakes, etc. Metals like nickel, cobalt, tin, etc., have been co-deposited with zinc to achieve these goals.

While barrier layers of zinc with nickel (by way of example) represent an improvement over an alloyed zinc or brass, in terms of resisting the loss of bond due to high laminating temperatures, undercutting, etc., none of the above barrier layers offers a truly complete immunity to the dis-bonding environments.

On the other hand the metals capable of forming the barrier layers that could be immune to high-temperature induced decay of peel strength did not find application in the practice of manufacturing copper foil for MLB's.

Although the prior art discloses the use of a cobalt barrier layer (U.S. Pat. No. 3,857,681 to Yates et al.) cobalt is not used in practice, because it is a ferromagnetic metal and if present in considerable quantity in a printed circuit it will interfere with surface mounted memory devices (ROM, EPROM, RAM and other magnetically stored devices). However, the prior knowledge of cobalt plating techniques does not enable plating a continuous layer of cobalt which is sufficiently thin to not lead to the magnetic problems, but at the same time is sufficiently continuous to form a barrier layer capable of good performance in terms of assuring "durability" of foil's bonding properties.

SUMMARY OF THE INVENTION

One object of the present invention is to overcome the drawbacks of the above prior art by providing a copper foil having a cobalt barrier layer which is free of the above magnetic problems and which enables durable binding to a polymeric substrate when used in the manufacture of PCB's. Other objects are a process and an electrolyte useful for producing such barrier layer. The above and other objects of the invention will become apparent from the following description and from practice of the invention.

The objects of the invention may be achieved by a treated copper foil for use in the manufacture of printed circuit boards, which is formed of: (a) an electrodeposited copper base foil having a shiny drum side and an electrolyte side with a matte surface; (b) a bond-enhancing copper treatment layer electrodeposited on a bonding side of the base foil, the treatment having a surface micro-profile formed by micro-peaks and micro-valleys; and (c) a cobalt barrier layer electrodeposited on the treatment layer, wherein the cobalt forming the barrier layer has a surface coverage rate of from about 0.03 to about 0.2 grams per square meter and is deposited as a continuous layer of substantially uniform thickness on the micro-peaks and micro-valleys of the micro-profile of the treatment surface.

The present invention also provides a process for the production of treated copper foil useful in the manufacture of pointed circuit boards, which process comprises (a) providing an electrodeposited copper base foil having a bond-enhancing copper treatment electrodeposited on a bonding side of the base foil; and (b) electrodepositing on the treatment a cobalt barrier layer under electrodeposition conditions which include the use of an electrolyte which contains, preferably, from about 4 to 30 grams per liter cobalt ions, and minor amounts of each of a gelatin and a polyglycol addition agent and which are effective to deposit a continuous cobalt layer of substantially uniform thickness.

BRIEF DESCRIPTION OF THE DRAWINGS

The present invention will be described below with reference to the accompanying drawings, wherein.

DESCRIPTION OF PREFERRED EMBODIMENTS

Figure 1:
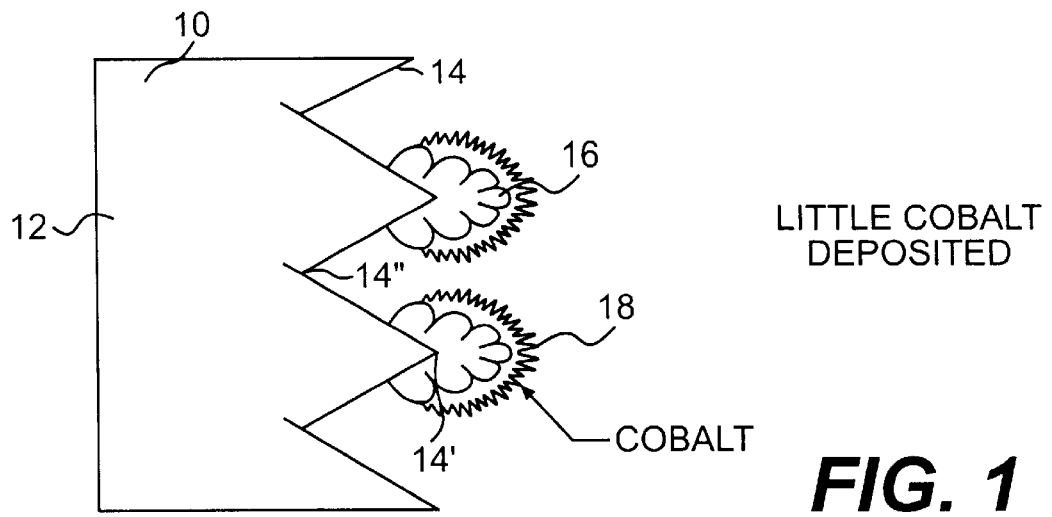
FIG. 1 illustrates a prior art treated copper foil having one type of cobalt barrier layer.
Figure 2:
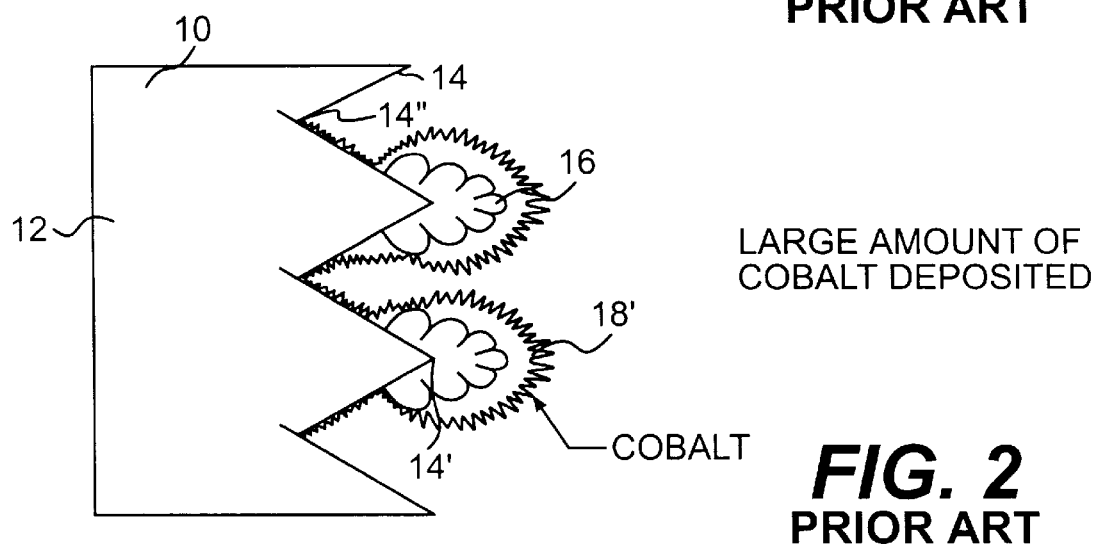
FIG. 2 illustrates a prior art treated copper foil heaving a second type of cobalt barrier layer.
Figure 3:
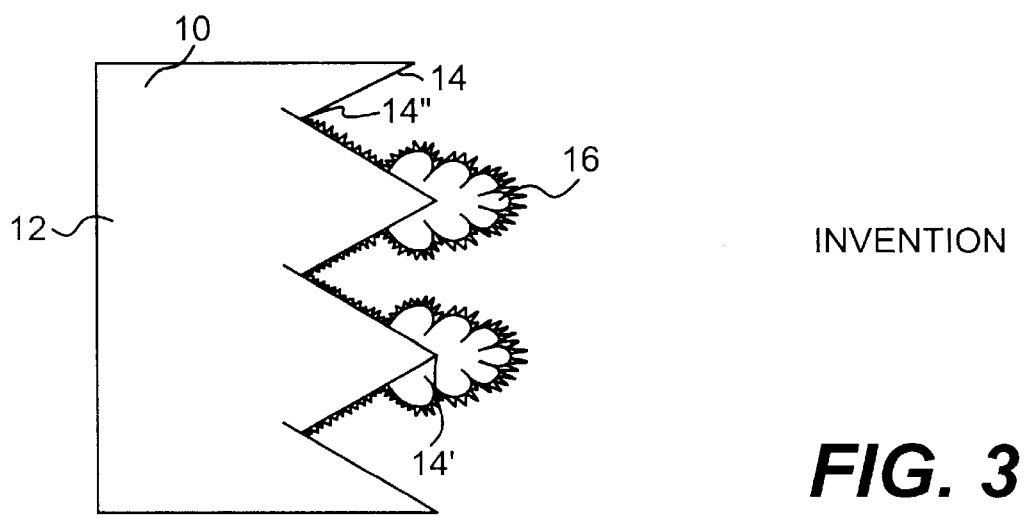
FIG. 3 illustrates a treated copper foil in accordance with the present invention.

Referring to the drawings, FIGS. 1, 2, and 3 illustrate a side-view of an electrolytic copper base foil 10 having a shiny drum side 12 and an electrolyte side 14 with a micro-profile formed of micro-peaks 14' and micro-valleys 14". The base foil is formed by electrodepositing copper on a drum-cathode from a sulfuric acid/copper sulfate electrolyte, using techniques which are well-known and need not be described further herein. The base foil 10 has electrodeposited on a bonding side thereof, preferably the electrolyte side 14, a copper bond-enhancing treatment, which is preferably a plurality of copper layers formed of a dendritic copper deposit and an encapsulating copper layer, as described in U.S. Pat. Nos. 3,857,618, 4,572,768 and 5,207,889, each of which is incorporated herein by reference. The bond-enhancing treatment 16 typically is deposited mainly on the micro-peaks 14', and the surface of such treatment has a micro-roughness (Rz, the average peak to valley amplitude).

FIG. 1 illustrates a prior art form of a cobalt barrier layer 18 electrodeposited on treatment 16, wherein only a small amount of cobalt has been deposited, mostly on the micro-peaks of the treatment 16. FIG. 2 illustrates another prior art cobalt barrier layer 18', wherein a large amount of cobalt has been deposited in treatment 14, with large amounts in micro-peaks of treatment 16 and much smaller amounts in micro-valleys 14" of treatment 14.

With the Rz of the bonding treatment typically ranging from 5 to 15 microns, the peak-to-valley amplitude is comparable with the thickness of the cathode diffusion layer which is present in the electro-deposition of the cobalt barrier layer. As is well-known, the structure and properties of an electrodeposit can be changed by changing the micro-throwing power of the electrolyte. The usual practice of plating cobalt stipulates the use of a high concentration of cobalt in the electrolyte, with no addition agents, for example, from about a hundred to several hundred grams of a cobalt salt per liter of electrolyte. Under such conditions the micro-throwing power is positive and directs most of the deposit toward the peaks.

Referring to FIG. 1, since the mass of the barrier layer composed of cobalt should be low, for reasons explained above (i.e., only very small amount of cobalt can be plated over the surface of the bonding treatment), in the prior art methods virtually all cobalt is plated on the peaks 14', with the cobalt not being able to reach the valleys 14". This means that the cobalt layer is not continuous, lacks integrity, does not completely shield metallic copper of the bonding treatment underneath, and thus can not fulfill the functions required of the barrier layer.

Referring to FIG. 2, if large amounts of cobalt are plated over the microprofile of the bonding treatment, the peaks will still be favored, but a thinner coating of cobalt will reach the valleys as well. In this case, however, the large amount of cobalt would constitute the outer layer of the foil, and become the part of circuitry in the fabrication of PCB's. This is not desirable because of magnetic properties of cobalt.

The present invention resolves the dilemma described above. surprisingly, it has now been discovered that the combination of an extremely dilute concentration of cobalt ions in the electrolyte combined with the use of empirically chosen addition agents, enables a process for electrodepositing a cobalt barrier layer which assures complete "fidelity" of distribution of cobalt over the micro-profile (contour) of the bonding treatment, while at the same time an extremely thin layer of cobalt can be plated. Thus our process enables forming a continuous layer that assures excellent performance as a barrier layer, yet the amount of cobalt is so low, that it does not interfere with the non-magnetic requirements of the PCB industry.

After extensive experimentation we have discovered that in electrodepositing the present cobalt barrier layer on the copper bonding treatment it is critical to use in the electrolyte a low cobalt concentration, and certain addition agents which inhibit cobalt favoring the peaks. The thickness of the cathode diffusion layer is inversely proportional to the concentration of cobalt in the electrolyte, so there is provided in the process a very thick diffusion layer, which, in combination with addition agents which inhibit cobalt favoring the peaks, permits electrodeposition of a cobalt barrier layer that assures excellent performance in terms of protecting the bonding treatment against decay due to extreme thermal exposure, and the undercutting by the etching solutions used in fabrication of PCB's.

In accordance with the present invention, an electrodeposited base foil having a bond-enhancing copper treatment electrodeposited on a bonding side, either the drum side or the electrolyte side, of the foil, preferably the electrolyte side thereof, is passed through an electrolyte in a treater tank. The treated foil is rendered cathodic and a direct electric current is passed through the electrolyte from one or more anodes to electrodeposit a cobalt barrier layer on the bonding treatment. The construction and operation of treater tanks are well-known and need not be described herein for example see U.S. Pat. No. Nos. 3,857,681 and 4,572,768, which are incorporated herein by reference.

The electrolyte in the barrier layer treater tanks is a boric acid/cobalt, e.g., cobalt sulfate ($CoSo_4$) aqueous solution containing a relatively low concentration of cobalt ions, e.g., less than about 40, and preferably in the range of from about 4 to about 30, grams per liter of electrolyte. The case of the electrodeposition of the barrier layer over the surface of the bonding treatment (dendritic deposit followed by encapsulating deposit or the gilding layer) is the case of plating on a micro-profile with very pronounced peaks and valleys.

Normal electrodeposition accentuates roughness by putting more deposit on the peaks than in the valleys of the plated surface, since the current density is highest at the peaks because electric field strength is greater in that region.

In order to produce an even distribution of the metal constituting barrier layer over the peaks and the valleys (so-called neutral micro-throwing power) the normal effect of the preferential plating over the peaks has to be partially inhibited.

The function of certain organic compounds (addition agents, inhibitors) is to change the micro-throwing power of plating solution and the process. Such substances, if adsorbed preferentially on the peaks, inhibit metal deposition on the peaks and thus encourage deposition in the valleys.

This inhibiting power is destroyed on the surface by a chemical reaction which releases it, setting up a concentration gradient close to the surface. As a result, a so-called micro-throwing power of the plating electrolyte can be changed, which in turn provides the ability to deliberately change the micro-structure and the properties of the deposit.

Addition agents which may be useful in the present process are water soluble, high molecular weight organic compounds (polymers), which may be synthetic or natural. Polyethylene and polypropylene glycols, polyethers, polyethyleneimine, gelatin hydroxyethylcellulose and other cellulose derivatives, sulfonated organic sulphur compounds may be found useful. However, polyglycols and gelatins are preferred addition agents, and a minor amount of each of a hydrolyzed gelatin and polypropylene glycol has been found to be most preferable.

$(NH_4)_2SO_4$ is employed in the electrolyte and serves as a mild complexing compound to improve the conductivity of the cobalt plating electrolyte.

$H_3BO_3$ is used in the electrolyte as a buffer that stabilizes the pH at the electrolyte/cathode (copper foil) interface.

In order to produce a sufficiently thick cathode diffusion layer (which in combination with the above addition agents reduces the tendency of cobalt to be deposited on the peaks so as to enable a thin, but continuous, cobalt deposit of substantially uniform thickness) the cobalt concentration in the electrolyte should be relatively low. If the cobalt ion concentration is less than about 3 or 4 g/l a satisfactory continuous deposit may not be formed, and if the cobalt ion concentration exceeds about 30 or 40 g/l there may not be formed a cobalt layer which is incapable of exhibiting a sufficiently low level of ferromagnetism for use in PCB's on which magnetic memory devices are to be mounted. It has been found that a cobalt concentration of from 4 to 30 g/l is preferred.

The electrolyte should be mildly-to-strongly acidic, and preferably is maintained in the range of from about 2 to about 4.

The temperature of the electrolyte advantageously is not greater than about 50° C., and preferably is in the range of from about 15–40° C.

During the plating of the cobalt layer the current density of the direct current employed may be in the range of from about 1 to about 10 A/dcm$^2$. A plating time of from about 3 to about 10 seconds may be used to deposit cobalt on the treatment surface at a surface coverage rate of from about 0.03 to 0.2 g/m$^2$ (i.e., per one meter square of foil).

The aforementioned electrolyte and plating parameters have been found capable of depositing on the surface of a bonding treatment a thin substantially uniform thickness layer of cobalt which is continuous over the microprofile of the surface and which does exhibit detectable magnetism when exposed to the field of a hand-held magnet.

It is estimated that the real surface area of a typical copper foil with the bonding treatment is about 7 times bigger than the projected area of the foil.

For a typical prior art cobalt barrier layer having 0.37 g/m$^2$ cobalt surface coverage the average thickness of cobalt is about 6 nanometers (or 60 Å), based upon a $10^{-11}$ m (or 0.06 nm) for atomic diameter of Co. This represents about 100 layers of Co atoms.

For 0.04 g/m$^2$ cobalt surface coverage, as in accordance with the present invention, the average thickness of the Co layer is about 0.65 nm (6.5 Å), representing about 10 layers of Co atoms. Thus, the thickness of the cobalt layer of the present invention is significantly less than prior art continuous cobalt barrier layers, which exhibit a level of magnetism which interferes with magnetic memory devices.

Preferred embodiments of the present electrolyte are shown in the following table.

Electrolyte for the electrodeposition of cobalt barrier layer

| | Concentration | |
|---|---|---|
| | g/l or ppm preferred range | most preferred |
| Co (added as CoSo$_4$) | 4–30 | 4 |
| (NH$_4$)2SO$_4$ | 10–50 | 20 |
| H$_3$BO$_3$ | 10–50 | 20 |
| Hydrolyzed calf gelatin | 2–20 ppm | 5 ppm |
| Polyproylene glycol m.w. 425 | 2–20 ppm | 5 ppm |
| Temperature | 15–40° C. | Room |
| pH | 2–4 | 2.5 |

In the electrodeposition of the present cobalt barrier layer treated copper foil is passed through the above electrolyte with the bonding treatment facing one or more inert anodes A direct electric current is passed through the electrolyte from the anode(s) to the copper foil, which has been rendered cathodic, to deposit the cobalt barrier layer on the bonding treatment.

When using the electrolyte described above, the plating parameters shown in the following table have been found effective in electrodepositing on the surface of the treatment a continuous layer of cobalt which is plated in a substantially uniform thickness on the surface of the micro-peaks and micro-valleys forming the surface of the treatment. We have found that when so-deposited the cobalt layer provides the above-mentioned protection of the bonding treatment during the manufacture and use of PCB's, while at the same time not giving rise to magnetism problems when magnetically stored devices are mounted on such PCB's.

Plating parameters for the electrodeposition of cobalt barrier layer

| | Preferred Range | Most Preferred |
|---|---|---|
| Current density | 1–10 A/dcm$^2$ | 1 A/dcm$^2$ |
| Plating Time | 3–10 sec | 4 sec |
| Surface coverage | 0.03–0.2 g/m$^2$ | 0.04 g/m$^2$ |

The present invention will be more fully understood from the following examples, which demonstrate benefits of the present invention.

EXAMPLE

A web of base (raw) foil was processed through a treater machine to provide the matte side of the foil with a copper bonding treatment (dendritic deposit, followed by gilding layer), according to U.S. Pat. No. 3,857,681. The barrier layer station of the treater provided electrodeposition of a Zn/Ni/Sb barrier layer over the surface of the bonding treatment (according to U.S. Pat. No. 4,572,768).

The barrier layer treater tank was then emptied, thoroughly rinsed and filled with an aqueous solution of the above-described most preferred barrier layer electrolyte, prepared according to this invention.

The above procedure was then repeated, the only difference in the treatment process being that in the latter a cobalt barrier layer was electrodeposited on the bonding treatment using the most preferred electrolyte and plating parameters described in the above table.

Examination of the surface of foil provided with the cobalt barrier layer indicated that the present cobalt layer was formed in a continuous manner over the microprofile of the treatment, and the foil did not exhibit ferromagnetism when a hand-held magnet was brought into close proximity to the barrier layer. On the other hand, when a continuous cobalt layer was deposited on the bonding treatment using prior art techniques, including prior addition agents, the resulting cobalt layer exhibited significant magnetism when brought into close proximity to the same magnet.

The samples of copper foil representing the treatment with the Zn/Ni/Sb barrier layer and the treatment with the cobalt barrier layer according to invention, were tested for properties pertinent to requirements of the printed circuit industry, and the results are shown in the following table.

Figure 4:
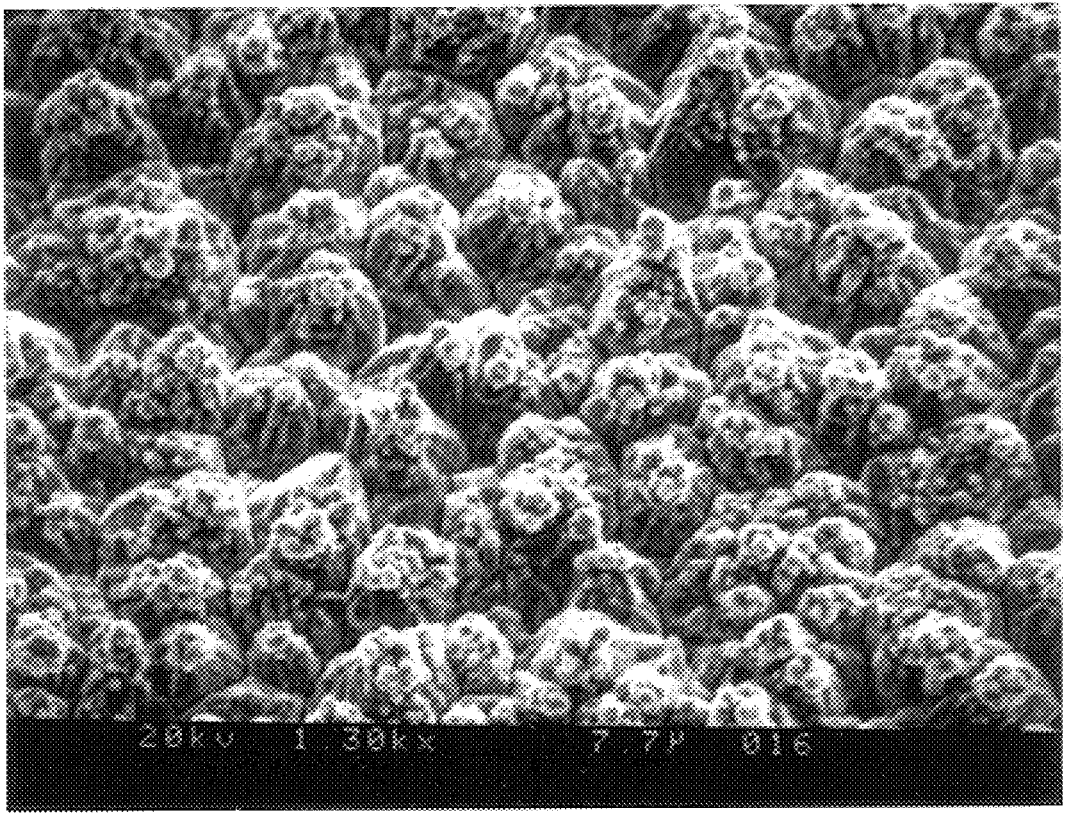
FIG. 4 is a microphotograph of surface of treated foil in accordance with the invention.

FIG. 4 is a microphotograph (1000×) of the surface of the above treated foil provided with the cobalt barrier layer of the present invention.

Test results comparing performance of Co barrier layer versus Zn/Ni/Sb barrier layer (*U.S. Pat. No. 4,572,768)

| | Invention Co | Comparative Zn/Ni/Sb |
|---|---|---|
| Peel strength lbs/inch Epoxy substrate | 11.2 | 11.2 |
| Peel strength lbs/inch Epoxy substrate after post bake 380° F., 16 hours | 11 | 10.0 |
| Peel strength of 1 mm line, lbs/mm epoxy substrate | 0.44 | 0.42 |
| Peel strength of 1 mm line after ½ hour exposure to 1:1 HCl (lbs/mm) | 0.44 | 0.34 |
| Peel strength HCl loss % | 0 | 19 |
| Peel strength (lbs/inch) Polyimide substrate | 11.0 | 7.8 |

While cobalt is generally considered to be a ferromagnetic material, it is known that in certain forms cobalt are non-magnetic or poremagnetic. It is also known that the magnetic properties of various metals can be influenced by their grain orientation, which can be influenced by addition agents used in an electrolyte used in electrodeposition of such metals. Although we can not fully explain the reasons which cause the present cobalt barrier layer to not exhibit magnetisms, we believe that the presence in the electrolyte of the above-described addition agents, such as polypropylene glycols, gelatin and polyethyleneimine, causes the ferromagnetic properties of electrodeposited cobalt to be suppressed.

Having described preferred embodiments of the present invention, it will be appreciated that variations and modifications thereof falling within the spirit of the invention may become apparent from a reading of the description. Therefore, it is intended that the scope of the invention is to be determined by the appended claims and their equivalents.

What is claimed is:

1. Treated copper foil for use in the manufacture of printed circuit boards, comprising:

(a) an electrodeposited copper base foil having a shiny drum side and an electrolyte side with a matte surface;

(b) a bond-enhancing copper treatment electrodeposited on a bonding side of the base foil, the treatment having a surface micro-profile formed by micro-peaks and micro-valleys; and (c) a cobalt barrier layer electrodeposited on the treatment layer, wherein the cobalt forming the barrier layer has a surface coverage rate of from about 0.03 to about 0.2 grams per square meter and is deposited as a continuous layer on the micro-peaks and micro-valleys of the micro-profile of the treatment surface.

2. A process for the production of treated copper foil useful in the manufacture of pointed circuit boards, which process comprises:

(a) providing an electrodeposited copper base foil having a bond-enhancing copper treatment layer electrodeposited on a bonding side of the base foil; and (b) electrodepositing on the treatment layer a cobalt barrier layer under electrodeposition conditions which include the use of an electrolyte which contains from about 4 to 30 grams per liter cobalt ions, and minor amounts of each of a gelatin and a polyglycol addition agent and which are effective to form a continuous layer of cobalt having a substantially uniform thickness.

3. The process of claim 2, wherein the electrolyte is a sulfuric acid solution which contains, per liter of the electrolyte, 4–30 g/l Co, 10–50 g/l ammonium sulfate, 10–50 g/l boric acid, 2–20 ppm hydrolyzed calf gelatin, and 2–20 ppm polypropylene glycol.

4. The process of claim 3, wherein the electrolyte has a pH of 2–45 and a temperature of 15–40° C.

5. The process of claim 2, wherein the electrodeposition conditions include passing a direct electric current through the electrolyte at a current density in the range of from 1 to 10 amperes per square decimeter, a plating time in range of from 3 to 10 seconds, and the cobalt is electrodeposited on the treatment at a surface coverage rate in the range of from 0.03 to 0.2 grams per square meter.

6. The copper foil of claim 1, wherein the copper treatment layer is electrodeposited on the matte surface of the base foil.

7. The copper foil of claim 1, wherein the copper treatment is formed of one or more dendritic copper layers and one or more copper gilding layers.

8. An aqueous solution useful as an electrolyte in the electrodeposition of a thin layer of cobalt on a treated copper foil, which solution comprises, per liter of the solution, about 4–30 g/l cobalt ions, about 10–50 g/l $(NH_4)2SO_4$, about 10–50 g/l $H_3BO_3$, about 2–20 ppm hydrolyzed gelatin, and about 2–20 ppm of a polyglycol.

9. The copper foil of claim 1, wherein the copper treatment layer is electrodeposited on the drum side of the base foil.

10. Treated copper foil for use in the manufacture of printed circuit boards, comprising:

(a) an electrodeposited copper base foil having a shiny drum side and an electrolyte side with a matte surface;

(b) a bond-enhancing copper treatment electrodeposited on a bonding side of the base foil, the treatment having a surface micro-profile formed by micro-peaks and micro-valleys; and (c) a cobalt barrier layer electrodeposited on the treatment layer, wherein the cobalt forming the barrier layer is deposited as a continuous layer on the micro-peaks and micro-valleys of the micro-profile of the treatment surface and is non-magnetic.

11. Copper foil produced by the process of claim 2, wherein the layer of cobalt is non-magnetic.

* * * * *